United States Patent
Kim et al.

(10) Patent No.: US 10,936,481 B2
(45) Date of Patent: Mar. 2, 2021

(54) SEMICONDUCTOR SYSTEM AND METHOD FOR OPERATING THE SEMICONDUCTOR SYSTEM

(71) Applicant: SK hynix Inc., Gyeonggi-do (KR)

(72) Inventors: Yong-Ju Kim, Seoul (KR); Dong-Gun Kim, Gyeonggi-do (KR); Do-Sun Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/682,705

(22) Filed: Aug. 22, 2017

(65) Prior Publication Data

US 2018/0165187 A1 Jun. 14, 2018

(30) Foreign Application Priority Data

Dec. 12, 2016 (KR) .................. 10-2016-0168511

(51) Int. Cl.
*G06F 12/02* (2006.01)
*G11C 16/34* (2006.01)
*G11C 8/06* (2006.01)
*G11C 16/08* (2006.01)
*G11C 7/04* (2006.01)

(52) U.S. Cl.
CPC ...... *G06F 12/0246* (2013.01); *G06F 12/0238* (2013.01); *G11C 7/04* (2013.01); *G11C 8/06* (2013.01); *G11C 16/08* (2013.01); *G11C 16/349* (2013.01); *G11C 16/3418* (2013.01); *G06F 2212/1036* (2013.01); *G06F 2212/7211* (2013.01)

(58) Field of Classification Search
None
See application file for complete search history.

(56) References Cited

U.S. PATENT DOCUMENTS

| | | | |
|---|---|---|---|
| 7,882,134 B2* | 2/2011 | Pattabhi | G06F 17/30306 707/791 |
| 8,996,790 B1* | 3/2015 | Segal | G06F 12/0246 711/103 |
| 2012/0265928 A1* | 10/2012 | Mun | G11C 16/10 711/103 |
| 2013/0013854 A1* | 1/2013 | Mun | G11C 16/0483 711/103 |

(Continued)

FOREIGN PATENT DOCUMENTS

| | | |
|---|---|---|
| CN | 104077084 A | 10/2014 |
| CN | 104102585 A | 10/2014 |
| KR | 101587464 | 1/2016 |

OTHER PUBLICATIONS

Office Action issued by the Chinese Patent Office dated Dec. 18, 2020.

*Primary Examiner* — Pierre Miche Bataille
*Assistant Examiner* — Ryan Dare
(74) *Attorney, Agent, or Firm* — IP & T Group LLP

(57) ABSTRACT

A semiconductor system may include: a volatile memory device that stores an address mapping table including mapping information for a non-volatile memory device; and a control device suitable for reading one or more seed values from the volatile memory device before the address mapping table is stored, generating a plurality of random values based on the seed values, and initializing mapping information to the plurality of random values.

20 Claims, 4 Drawing Sheets

(56) References Cited

U.S. PATENT DOCUMENTS

| | | | | |
|---|---|---|---|---|
| 2015/0355886 A1* | 12/2015 | Peeters | ............... | G06F 7/588 |
| | | | | 708/250 |
| 2016/0179663 A1* | 6/2016 | Roesch | ............... | G06F 7/58 |
| | | | | 711/103 |
| 2017/0090873 A1* | 3/2017 | Clark | ............... | G06F 7/588 |
| 2017/0123687 A1* | 5/2017 | Kim | ............... | G06F 3/0611 |
| 2017/0242660 A1* | 8/2017 | Katoh | ............... | H01L 45/08 |
| 2018/0059976 A1* | 3/2018 | Helmick | ............... | G06F 3/0688 |

\* cited by examiner

FIG. 3

| Logical Address (LADD) | Physical Address (PADD) | Write Count (WCNT) | | Address Conversion (KEY) |
|---|---|---|---|---|
| 1 | Random Mapping | Fixed Initial Value | Random Initial Value | Random Value |
| 2 | Random Mapping | Fixed Initial Value | Random Initial Value | Random Value |
| .. | .. | .. | .. | .. |

SEMICONDUCTOR SYSTEM AND METHOD FOR OPERATING THE SEMICONDUCTOR SYSTEM

CROSS-REFERENCE TO RELATED APPLICATIONS

The present application claims priority under 35 U.S.C. 119(a) to Korean Patent Application No. 10-2016-0168511, filed on Dec. 12, 2016, which is incorporated herein by reference in its entirety.

BACKGROUND

1. Field

Various embodiments of the present invention relate generally to a semiconductor design technology and, more particularly, to a semiconductor system and a method for operating the semiconductor system.

2. Description of the Related Art

Memory devices tend to deteriorate according to environmental conditions, operational times, the number of access times to access, and other factors. When such deterioration of the memory devices exceeds a threshold level, reliability of data stored in the memory devices may not be secured.

A memory device includes a plurality of memory regions. Deterioration states of the memory regions may be different from each other. Life of the memory device may be determined according to the most deteriorated memory region.

Wear-leveling techniques have been designed to prolong the life of a memory device. The wear-leveling techniques are designed to distribute more uniformly access to the memory regions of a memory device, to thereby prevent rapid deterioration of some memory regions.

Typically, wear-leveling techniques continuously update an address mapping table for uniformly distributing the number of access times to the various regions of a memory device. For example, the wear-leveling techniques may continuously update at least one mapping information included in the address mapping table. The mapping information may include write count information, and address conversion (or translation) information between a logical address and a physical address.

However, such wear-leveling techniques result in a substantial overhead increase of the semiconductor memory device. For example, when write count information for each memory cell or memory region is initialized to the same value, the write count number of access times of memory cells or memory regions may simultaneously reach the preset limit. Simultaneous performance of the wear leveling operation on multiple memory cells or memory regions that reach the preset access limit results in a substantial overhead increase.

SUMMARY

Various embodiments of the present invention are directed to an improved control device capable of initializing mapping information to random values, a semiconductor system including the control device, and a method for operating the semiconductor system.

In accordance with an embodiment of the present invention, a semiconductor system may include: a volatile memory device that stores an address mapping table including mapping information for a non-volatile memory device; and a control device suitable for reading one or more seed values from the volatile memory device before the address mapping table is stored, generating a plurality of random values based on the seed values, and initializing mapping information to the plurality of random values.

The mapping information may include write count information for the non-volatile memory device and address translation information between a logical address and a physical address for the non-volatile memory device.

The control device may read the seed values from the volatile memory device and uses the seed values as the random values.

The control device may include a linear feedback shift register (LFSR) for generating the random values based on the seed values.

The control device may update the mapping information based on a performance result of a wear-leveling operation.

The semiconductor system may further include: a temperature sensor suitable for measuring temperature of the volatile memory device, wherein the control device may set read latency based on the temperature and read the seed values from the volatile memory device after the volatile memory device is initialized and the read latency time elapses.

The non-volatile memory device may include a phase change random access memory (PCRAM).

In accordance with another embodiment of the present invention, a semiconductor system may include: a non-volatile memory device; a volatile memory device; and a control device suitable for accessing the non-volatile memory device based on an address mapping table including mapping information for the non-volatile memory device and initializing the mapping information to a plurality of random values based on one or more seed values read from the volatile memory device.

The address mapping table may be stored in the volatile memory device, and the seed values may be randomly generated from the volatile memory device before the address mapping table is stored.

The mapping information may include write count information for the non-volatile memory device and address translation information between a logical address and a physical address for the non-volatile memory device.

The control device may read the seed values from the volatile memory device and use the seed values as the random values.

The control device may generate the random values based on the seed values.

The control device may include a linear feedback shift register (LFSR).

The control device may generate the address mapping table based on the seed values and store the address mapping table in the volatile memory device.

The control device may perform a wear-leveling operation and update the mapping information based on a performance result of the wear-leveling operation.

The semiconductor system may further include: a temperature sensor suitable for measuring temperature of the volatile memory device, wherein the control device may set read latency based on the temperature and read the seed values from the volatile memory device after the volatile memory device is initialized and the read latency time elapses.

The non-volatile memory device may include a phase change random access memory (PCRAM), and the volatile memory device may include a dynamic random access memory (DRAM).

In accordance with another embodiment of the present invention, a method for driving a semiconductor system may include: initializing mapping information included in an address mapping table to a plurality of random values based on one or more seed values read from a volatile memory device in an initialization mode; and accessing a non-volatile memory device based on the address mapping table in a normal mode.

The initialization mode may include a boot-up mode and a reset mode.

The initializing of the mapping information included in the address mapping table to the random values in the initialization mode may include: initializing the volatile memory device; reading the seed values from the volatile memory device after read latency time elapses; generating the random values based on the seed values; generating the address mapping table based on the random values; storing the address mapping table in the volatile memory device; and refreshing the volatile memory device.

The initializing of the mapping information included in the address mapping table to the random values in the initialization mode may further include: measuring temperature of the volatile memory device; and setting the read latency based on the temperature.

In the normal mode, the mapping information may be updated based on a performance result of a wear-leveling operation.

BRIEF DESCRIPTION OF THE DRAWINGS

FIG. 3 is a diagram illustrating an address mapping table in accordance with an embodiment of the present invention.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "Including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
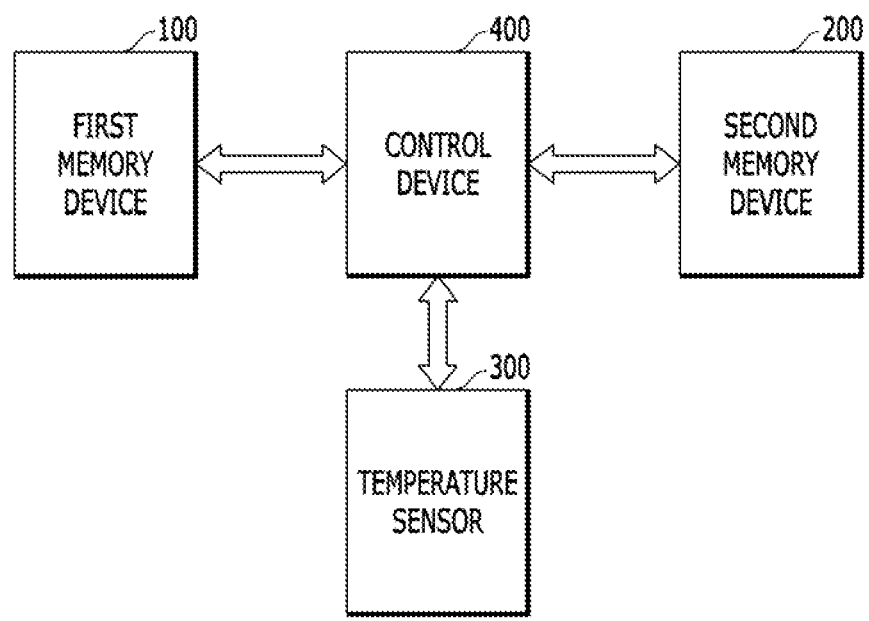
FIG. 1 is a block diagram illustrating a semiconductor system in accordance with an embodiment of the present invention.

FIG. 1 is a block diagram illustrating a semiconductor system in accordance with an embodiment of the present invention.

Referring to FIG. 1, the semiconductor system may include a first memory device 100, a second memory device 200, a temperature sensor 300, and a control device 400.

The first memory device 100 may include a non-volatile memory device. The non-volatile memory device may include a phase change random access memory (PCRAM). The first memory device 100 may store a write data received from the control device 400 or output a read data to the control device 400 in a normal mode.

The second memory device 200 may include a volatile memory device required for a refresh operation. The volatile memory device may include a dynamic random access memory (DRAM). The second memory device 200 may supply one or more seed values that are randomly generated to the control device 400 and store an address mapping table generated from the control device 400, in an initialization mode. The seed values may be generated from a memory cell array included in the second memory device 200. For example, since the memory cell array included in the DRAM may maintain a floating state after being initialized, the DRAM may read the seed values that are randomly defined from the memory cell array.

The temperature sensor 300 may measure a temperature of the second memory device 200. The temperature sensor 300 may be in contact, preferably direct contact with the second memory device. For example, the temperature sensor may be disposed on, adjacent to, or in the second memory device 200.

The control device 400 may access the first memory device 100 based on the address mapping table in the normal mode. The control device 400 may initialize mapping information which is included in the address mapping table to a plurality of random values based on the seed values in the initialization mode. The control device 400 may set read latency based on the temperature of the second memory device 200 and read the seed values from the second memory device 200 after the second memory device 200 is initialized and the read latency time elapses. Since circuit properties, performance characteristics and so on of the second memory device 200 may vary with the temperature of the second memory device 200, the control device 400 may set the read latency according to the temperature of the second memory device 200, thereby reading the seed values in an operational condition where the second memory device 200 is optimized.

Figure 2:
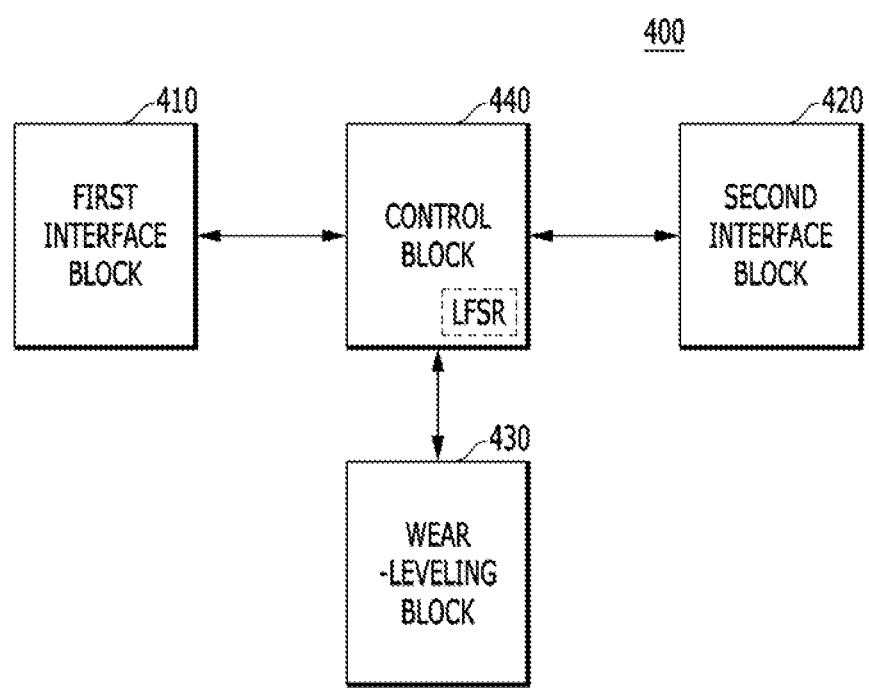
FIG. 2 is a block diagram illustrating a control device shown in FIG. 1.

FIG. 2 is a block diagram illustrating a control device in accordance with an embodiment of the present invention, for example, the control device 400 shown in FIG. 1.

Referring to FIG. 2, the control device 400 may include a first interface block 410, a second interface block 420, a wear-leveling block 430, and a control block 440.

The first interface block 410 may perform data communication with the first memory device 100. For example, the first interface block 410 may receive the read data from the first memory device 100 or output the write data to the first memory device 100.

The second interface block 420 may perform data communication with the second memory device 200. For example, the second interface block 420 may receive the seed values from the second memory device 200 or output the address mapping table to the second memory device 200.

The wear-leveling block 430 may perform a wear-leveling operation. For example, the wear-leveling block 430 may supply an updated value for replacing a memory cell whose deterioration state is relatively bad among a plurality of memory cells included in the first memory device 100 with a memory cell whose deterioration state is relatively good among the memory cells to the control block 440.

The control block 440 may initialize the mapping information to the random values based on the seed values. The control block 440 may generate the address mapping table including the mapping information and supply the address mapping table to the second memory device 200 through the second interface block 420. The control block 440 may update the mapping information included in the address mapping table based on the updated value.

The control block 440 may receive a plurality of seed values from the second memory device 200 and use the seed values as the random values. Alternatively, the control block 440 may receive one or more seed values from the second memory device 200 and generate the random values based on the one or more seed values. In this case, the control block 440 may include a linear feedback shift register (LFSR). The LFSR may generate the random values based on the one or more seed values.

FIG. 3 is a diagram illustrating an address mapping table in accordance with an embodiment of the present invention.

Referring to FIG. 3, the address mapping table may include logical address information LADD, physical address information PADD, write count information WCNT, and address translation information KEY between a logical address and a physical address, which correspond to the memory cells included in the first memory device 100. The mapping information may include the write count information WCNT, and the address translation information KEY between the logical address and the physical address. The write count information WCNT may correspond to the number of times that each of the memory cells is written. The address translation information KEY between the logical address and the physical address may correspond to a mapping value for replacing a memory cell whose deterioration state is relatively bad with a memory cell whose deterioration state is relatively good according to the number of times that each of the memory cells has been written.

Hereinafter, an operation of the semiconductor system in accordance with an embodiment of the present invention will be described with reference to FIGS. 4 to 7.

Figure 4:
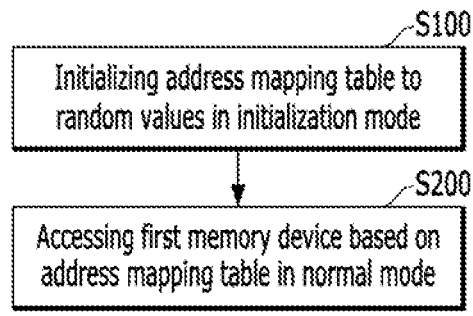
FIG. 4 is a flowchart illustrating an exemplary operation of a semiconductor system shown in FIG. 1.

FIG. 4 is a flowchart illustrating an operation of a semiconductor system, for example, the semiconductor system of FIG. 1, in accordance with an embodiment of the present invention.

Referring to FIG. 4, a method for operating the semiconductor system may include initializing the address mapping table to a plurality of random values in the initialization mode in step S100, and accessing the first memory device based on the address mapping table in the normal mode in step S200.

Specifically, in step S100, the plurality of mapping information included in the address mapping table may be initialized to the random values based on a plurality of seed values read from the second memory device 200 in the initialization mode. The initialization mode may include a boot-up mode and a reset mode.

In step S200, a write operation or a read operation may be performed by accessing the first memory device 100 based on the address mapping table in the normal mode. In addition, in step S200, the mapping information may be updated based on a performance result of the wear-leveling operation.

Figure 5:
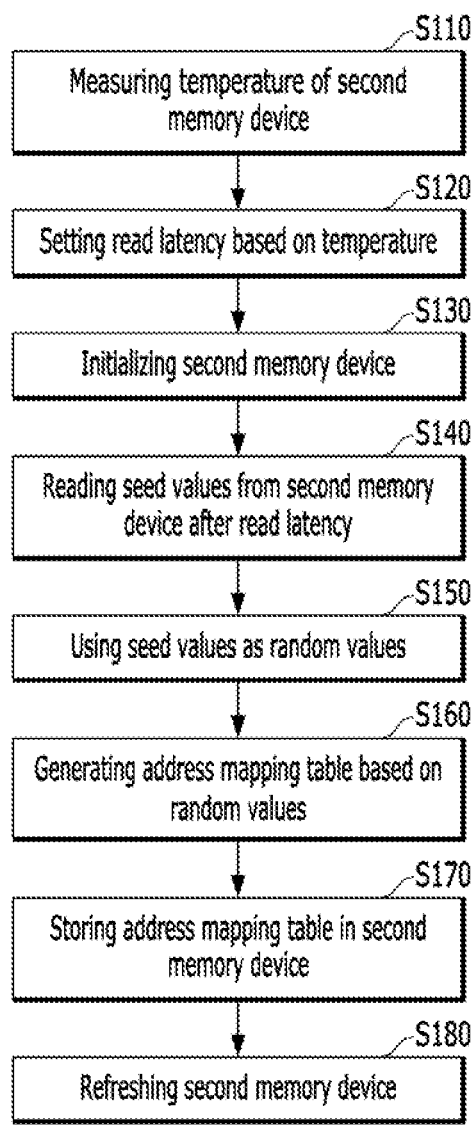
FIG. 5 is a flowchart illustrating an initializing process shown in FIG. 4.

FIG. 5 is a flowchart illustrating an initializing process in accordance with an embodiment of the present invention. For example, FIG. 5 illustrates detailed flows of the step S100 of initializing the address mapping table to the random values in the initialization mode shown in FIG. 4.

Referring to FIG. 5, the temperature sensor 300 of FIG. 1 may measure a temperature of the second memory device 200 under a control of the control device 400 in step S110. The control device 400 may set a read latency based on the measured temperature in step S120.

The second memory device 200 may be initialized under the control of the control device 400 in step S130. The second memory device 200 may output the seed values to the control device 400 after the read latency elapses under the control of the control device 400 in step S140. In other words, the control device 400 may read the seed values from the second memory device 200 after the read latency elapses. Since circuit properties, performance characteristics and so on of the second memory device 200 may vary with temperature, the seed values may be read in an operational condition where the second memory device 200 is optimized after the read latency that is previously set elapses. Accordingly, the seed values may be randomly defined. For example, since a memory cell array included in the second memory device 200 may have characteristics of maintaining a floating state after being initialized, the second memory device 200 may read the seed values, which are randomly defined, from the memory cell array.

The control device 400 may use the seed values as a plurality of random values in step S150. The control device 400 may generate the address mapping table based on the random values in step S160. The control device 400 may initialize the mapping information included in the address mapping table to the random values. After the address mapping table is generated, the control device 400 supplies the address mapping table to the second memory device 200, and the second memory device 200 may store the address mapping table in step S170.

Finally, the second memory device 200 may perform a refresh operation under the control of the control device 400 so as to prevent loss of the address mapping table in step S180.

Figure 6:
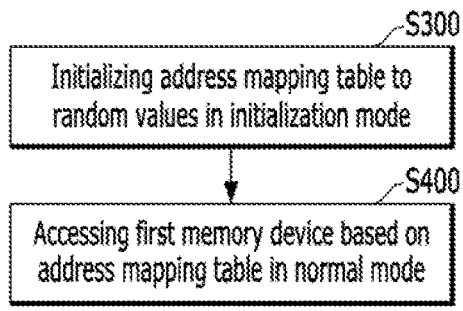
FIG. 6 is a flowchart illustrating an exemplary operation of a semiconductor system shown in FIG. 1.
Figure 7:
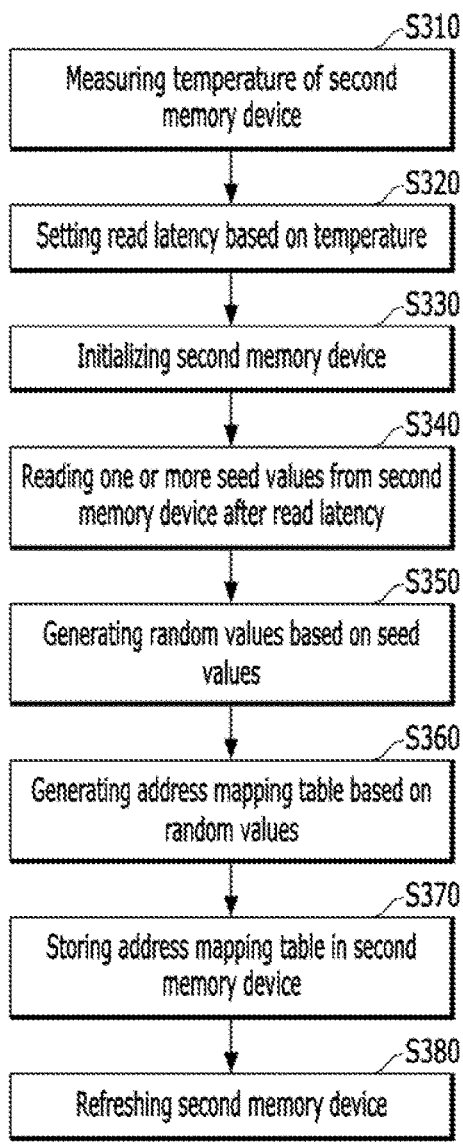
FIG. 7 is a flowchart illustrating an initializing process shown in FIG. 6.

FIG. 6 is a flowchart illustrating an operation of a semiconductor system, for example, the semiconductor system shown in FIG. 1, in accordance with another embodiment of the present invention. FIG. 7 is a flowchart illustrating an initializing process in accordance with another embodiment of the present invention. For example, FIG. 7 illustrates detailed flows of step S300 of initializing the address mapping table to the random values in the initialization mode shown in FIG. 6.

The operation of the semiconductor system shown in FIGS. 6 and 7 may be substantially similar to that of the semiconductor system shown in FIGS. 4 and 5, respectively. However, in the operation of the semiconductor system shown in FIGS. 6 and 7, one or more seed values may be read from the second memory device 200 (S340), and the control device 400 may generate a plurality of random values based on the seed values (S350). In this case, the LFSR included in the control device 400 may be enabled.

In accordance with the embodiments of the present invention, there is an advantage in that a circuit for generating random values required for initializing mapping information is unnecessary or minimized.

In accordance with embodiments of the present invention, it is possible to easily generate random values that may initialize mapping information.

In accordance with embodiments of the present invention, as the mapping information is initialized to the random values, an overhead due to a wear-leveling operation may decrease.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A semiconductor system, comprising:
a volatile memory device that stores an address mapping table including mapping information for a non-volatile memory device and is initialized in an initialization mode; and
a control device suitable for reading one or more seed values from the initialized volatile memory device before the address mapping table is stored, generating a plurality of random values based on the seed values, and initializing mapping information to the plurality of random values,
wherein the volatile memory device includes a memory cell array that maintains a floating state in the initialization mode,
wherein the initialization mode includes a boot-up mode or a reset mode,
wherein the control device sets read latency based on temperature of the volatile memory device and reads the seed values from the volatile memory device after the volatile memory device is initialized and the read latency elapses.

2. The semiconductor system of claim 1, wherein the mapping information includes write count information for the non-volatile memory device and address translation information between a logical address and a physical address for the non-volatile memory device.

3. The semiconductor system of claim 1, wherein the control device reads the seed values from the volatile memory device and uses the seed values as the random values.

4. The semiconductor system of claim 1, wherein the control device includes a linear feedback shift register (LFSR) for generating the random values based on the seed values.

5. The semiconductor system of claim 1, wherein the control device updates the mapping information based on a performance result of a wear-leveling operation.

6. The semiconductor system of claim 1, further comprising:
a temperature sensor suitable for measuring the temperature.

7. A semiconductor system, comprising:
a non-volatile memory device;
a volatile memory device that is initialized in an initialization mode; and
a control device suitable for accessing the non-volatile memory device based on an address mapping table including mapping information for the non-volatile memory device and initializing the mapping information to a plurality of random values based on one or more seed values read from the initialized volatile memory device,
wherein the volatile memory device includes a memory cell array that maintains a floating state in the initialization mode,
wherein the initialization mode includes a boot-up mode or a reset mode,
wherein the control device sets read latency based on temperature of the volatile memory device and reads the seed values from the volatile memory device after the volatile memory device is initialized and the read latency elapses.

8. The semiconductor system of claim 7, wherein the address mapping table is stored in the volatile memory device, and the seed values are randomly generated from the volatile memory device before the address mapping table is stored.

9. The semiconductor system of claim 7, wherein the mapping information includes write count information for the non-volatile memory device and address translation information between a logical address and a physical address for the non-volatile memory device.

10. The semiconductor system of claim 7, wherein the control device reads the seed values from the volatile memory device and uses the seed values as the random values.

11. The semiconductor system of claim 7, wherein the control device generates the random values based on the seed values.

12. The semiconductor system of claim 11, wherein the control device includes a linear feedback shift register (LFSR).

13. The semiconductor system of claim 7, wherein the control device generates the address mapping table based on the seed values and stores the address mapping table in the volatile memory device.

14. The semiconductor system of claim 7, wherein the control device performs a wear-leveling operation and updates the mapping information based on a performance result of the wear-leveling operation.

15. The semiconductor system of claim 7, further comprising:
a temperature sensor suitable for measuring the temperature.

16. A semiconductor system comprising:
a volatile memory device that stores an address mapping table including mapping information for a non-volatile memory device; and
a control device suitable for reading one or more seed values from the volatile memory device before the address mapping table is stored, generating a plurality of random values based on the seed values, and initializing mapping information to the plurality of random values,
wherein the control device sets read latency based on temperature of the volatile memory device and reads the seed values from the volatile memory device after the volatile memory device is initialized and the read latency elapses.

17. The semiconductor system of claim 16, wherein the mapping information includes write count information for the non-volatile memory device and address translation information between a logical address and a physical address for the non-volatile memory device.

18. The semiconductor system of claim 16, wherein the control device reads the seed values from the volatile memory device and uses the seed values as the random values.

19. The semiconductor system of claim 16, wherein the control device includes a linear feedback shift register (LFSR) for generating the random values based on the seed values.

20. The semiconductor system of claim 16, wherein the control device updates the mapping information based on a performance result of a wear-leveling operation.

* * * * *